(12) United States Patent
Wang et al.

(10) Patent No.: US 11,508,519 B2
(45) Date of Patent: Nov. 22, 2022

(54) CONTINOUS HEAT TREATMENT DEVICE AND METHOD FOR ALLOY WORKPIECE OR METAL WORKPIECE

(71) Applicant: Fujian Changting Golden Dragon Rare-Earth Co., Ltd., Fujian Province (CN)

(72) Inventors: Qingjiang Wang, Fujian Province (CN); Ying Luo, Fujian Province (CN); Jianpeng Wu, Fujian Province (CN)

(73) Assignee: Fujian Changting Golden Dragon Rare-Earth Co., Ltd, Fujian Province (CN)

( * ) Notice: Subject to any disclaimer, the term of this patent is extended or adjusted under 35 U.S.C. 154(b) by 366 days.

(21) Appl. No.: 16/620,712

(22) PCT Filed: Oct. 9, 2018

(86) PCT No.: PCT/CN2018/109524
§ 371 (c)(1),
(2) Date: Dec. 9, 2019

(87) PCT Pub. No.: WO2019/148882
PCT Pub. Date: Aug. 8, 2019

(65) Prior Publication Data
US 2021/0142943 A1 May 13, 2021

(30) Foreign Application Priority Data

Feb. 1, 2018 (CN) .......................... 201810100874.2
Apr. 8, 2018 (CN) .......................... 201810307941.8

(51) Int. Cl.
*H01F 41/02* (2006.01)
*C21D 9/00* (2006.01)
(Continued)

(52) U.S. Cl.
CPC ............ *H01F 41/0253* (2013.01); *B22F 3/24* (2013.01); *C21D 1/613* (2013.01); *C21D 1/773* (2013.01);
(Continued)

(58) Field of Classification Search
CPC ............. B22F 3/24; C21D 1/613; C21D 1/74; C21D 1/773; C21D 9/0056; C21D 9/0062;
(Continued)

(56) References Cited

U.S. PATENT DOCUMENTS 2,039,203 A * 4/1936 Ogilvy-Webb .......... C21D 9/46
266/252
6,147,328 A 11/2000 Loeser et al.
(Continued)

FOREIGN PATENT DOCUMENTS

| CN | 103231059 A | 8/2013 |
|---|---|---|
| CN | 103996521 A | 8/2014 |
| CN | 107406900 A | 11/2017 |

OTHER PUBLICATIONS

International Search Report in International Application No. PCT/CN2018/109524 dated Jan. 8, 2019, 4 pages.

*Primary Examiner* — Jessee R Roe
*Assistant Examiner* — Michael Aboagye
(74) *Attorney, Agent, or Firm* — Cooper Legal Group, LLC (57) ABSTRACT

Disclosed are a continuous heat treatment device and method for a sintered Nd—Fe—B magnet workpiece. The device comprises a first heat treatment chamber, a first cooling chamber, a second heat treatment chamber, and a second cooling chamber continuously disposed in sequence, as well as a transfer system disposed among the chambers to transfer the alloy workpiece or the metal workpiece; both the first cooling chamber and the second cooling chamber adopt (Continued)

a air cooling system, wherein a cooling air temperature of the first cooling chamber is 25° C. or above and differs from a heat treatment temperature of the first heat treatment chamber by at least 450° C.; a cooling air temperature of the second cooling chamber is 25° C. or above and differs from a heat treatment temperature of the second heat treatment chamber by at least 300° C. The continuous heat treatment device and method can improve the cooling rate and production efficiency and improve the properties and consistency of the products.

12 Claims, 1 Drawing Sheet

(51) Int. Cl.
| | |
|---|---|
| C21D 1/773 | (2006.01) |
| C21D 1/613 | (2006.01) |
| B22F 3/24 | (2006.01) |
| F27B 9/02 | (2006.01) |
| F27D 9/00 | (2006.01) |
| H01F 1/057 | (2006.01) |
| F27B 5/02 | (2006.01) |
| F27B 5/04 | (2006.01) |
| F27B 5/18 | (2006.01) |
| H01L 21/67 | (2006.01) |
| F27B 5/06 | (2006.01) |

(52) U.S. Cl.
CPC ......... *C21D 9/0056* (2013.01); *C21D 9/0062* (2013.01); *C21D 9/0068* (2013.01); *F27B 5/02* (2013.01); *F27B 5/04* (2013.01); *F27B 5/18* (2013.01); *F27B 9/028* (2013.01); *F27D 9/00* (2013.01); *H01F 1/0577* (2013.01); *H01L 21/67098* (2013.01); *H01L 21/67173* (2013.01); *H01L 21/67184* (2013.01); *B22F 2003/248* (2013.01); *B22F 2201/10* (2013.01); *C21D 2201/00* (2013.01); *F27B 2005/062* (2013.01); *F27D 2009/0072* (2013.01)

(58) Field of Classification Search
CPC ............ C21D 9/0068; F27B 5/02; F27B 5/04; F27B 5/18; F27B 9/028; F27D 2009/0072; F27D 9/00; H01F 1/0577; H01F 41/0253; H01L 21/67098; H01L 21/67173; H01L 21/67184; H01L 21/677
USPC ......... 266/249, 251, 252; 432/198, 199, 201
See application file for complete search history.

(56) References Cited

U.S. PATENT DOCUMENTS

| | | | | |
|---|---|---|---|---|
| 7,018,584 | B2* | 3/2006 | Serafini, Jr. | C21D 9/0062 |
| | | | | 432/198 |
| 7,029,625 | B2* | 4/2006 | Shimosato | F27B 9/028 |
| | | | | 266/252 |
| 8,182,263 | B2* | 5/2012 | Choi | F27B 9/02 |
| | | | | 432/133 |
| 8,734,147 | B2* | 5/2014 | Katsumata | F27B 17/0016 |
| | | | | 277/362 |
| 9,181,600 | B2* | 11/2015 | Katsumata | F27B 9/12 |

* cited by examiner ically at 800° C.-950° C.
CONTINOUS HEAT TREATMENT DEVICE AND METHOD FOR ALLOY WORKPIECE OR METAL WORKPIECE

TECHNICAL FIELD

The present invention relates to a heat treatment device and a heat treatment method, in particular to a continuous heat treatment method and device for an alloy workpiece or a metal workpiece.

BACKGROUND

The Nd—Fe—B rare earth permanent magnet material, which is currently an industrially produced magnet with the highest magnetic energy product, is widely used in the fields of wind power generation, servo motors, household appliance compressors, new energy auto motors, etc., and has the advantages of small size and high efficiency as compared to other magnets.

To obtain a magnet of desired properties, the Nd—Fe—B material is typically subjected to processes such as melting, crushing, pressing, sintering, heat treatment, etc. The heat treatment here includes a first-stage heat treatment and a second-stage heat treatment, typically at 800° C.-950° C. and 400° C.-650° C. respectively.

In the prior art, the Nd—Fe—B material is heat-treated using a single-chamber heat treatment furnace, where heating and cooling occur repeatedly. The heating and the cooling rates are difficult to control, which in turn increases energy consumption. Therefore, it is difficult to produce a Nd—Fe—B material of excellent properties and consistency by using the traditional single-chamber heat treatment furnace. In addition, since the single-chamber heat treatment furnace generally has a cylindrical furnace body, the inner wall of the cylindrical furnace body functions as a heat source, and the materials are mostly three-dimensional stacked in multiple rows, resulting in various distances from the materials at different positions to the heat source; the temperature consistency and uniformity within the furnace are therefore less ideal, which is particularly the case in the temperature difference between the core material and the peripheral material. Such an arrangement of the materials also limits the ability of the single chamber heat treatment furnace to cool down quickly.

SUMMARY

In view of the above problems, the present invention provides a continuous heat treatment device for an alloy workpiece or a metal workpiece, which can improve a cooling rate and production efficiency and improve product consistency.

The present invention adopts the following technical solutions:

A continuous heat treatment device for an alloy workpiece or a metal workpiece, comprising a first heat treatment chamber, a first cooling chamber, a second heat treatment chamber, and a second cooling chamber disposed in sequence by means of airtight devices, as well as a transfer system disposed among the chambers to transfer the alloy workpiece or the metal workpiece; both the first cooling chamber and the second cooling chamber adopt an air cooling system; a cooling air temperature of the first cooling chamber is 25° C. or above and differs from a heat treatment temperature of the first heat treatment chamber by at least 450° C.; a cooling air temperature of the second cooling chamber is 25° C. or above and differs from a heat treatment temperature of the second heat treatment chamber by at least 300° C.; and the pressures of the cooling chambers are 50 kPa-100 kPa.

The present invention adopts separately disposed heat treatment chambers and cooling chambers (adopting an air cooling system) and defines cooling air temperatures for the cooling chambers; a high-temperature material may be rapidly and uniformly cooled down according to a required cooling process after the completion of heat treatment of the material, optimizing the phase composition and distribution of the grain boundary microstructure of the alloy workpiece or the metal workpiece. The air cooling system can implement a forced convection to quickly remove the heat of the material, and can control the cooling rate according to the variable speed of a fan.

In the present invention, the pressures of the cooling chambers are 50 kPa-100 kPa, which is a conventional selection in the industry. The content range described above is therefore not tested or verified in the embodiments.

Another object of the present invention is to provide a continuous heat treatment method for an alloy workpiece or a metal workpiece. The continuous heat treatment method can improve the cooling rate and production efficiency and improve the properties and consistency of the products.

The present invention adopts the following technical solution:

A continuous heat treatment method for an alloy workpiece or a metal workpiece, wherein the method comprises a first-stage heat treatment, a first-stage air cooling treatment, a second-stage heat treatment, and a second-stage air cooling treatment performed in sequence in air-tight chambers, wherein a cooling air temperature of the first-stage air cooling treatment is 25° C. or above and differs from a heat treatment temperature of the first-stage heat treatment by at least 450° C.; and a cooling air temperature of the second-stage air cooling treatment is 25° C. or above and differs from a heat treatment temperature of the second-stage heat treatment by at least 300° C.

It should be noted that any numerical range disclosed in the present invention includes all point values in this range.

DETAILED DESCRIPTION OF EMBODIMENTS

The present disclosure is further described in detail in conjunction with examples hereinafter.

In a preferred embodiment, the alloy workpiece is a sintered Nd—Fe—B magnet. This is because during the research, the applicant discovers that the sintered Nd—Fe—B magnet can improve the squareness ratio, intrinsic coercivity, and consistency of the product after heat treatment and rapid cooling of the high-temperature material in the cambers; in particular, the intrinsic coercivity is improved significantly. This mechanism of action is still unclear at the present stage.

In a preferred embodiment, the air cooling system is an air cooling system adopting an inert gas. The inert gas herein is selected from the group consisting of helium, neon, argon, krypton, xenon, radon, or nitrogen gas that does not react with the alloy workpiece or the metal workpiece during the heat treatment or cooling treatment described above.

In a preferred embodiment, the heat treatment temperature of the first heat treatment chamber is 800° C.-950° C.; the cooling air temperature of the first cooling chamber is 25° C.-150° C.; the heat treatment temperature of the second treatment chamber is 400° C.-650° C.; and the cooling air temperature of the second cooling chamber is 25° C.-100° C. This allows the Nd—Fe—B material to quickly pass through the eutectic point to obtain a good squareness ratio and coercivity.

The content ranges, such as the temperature of the first heat treatment chamber being 800° C.-950° C. and the temperature of the second heat treatment chamber being 400° C.-650° C., are the conventional choices for the heat treatment process in the field of sintered Nd—Fe—B magnets; thus, in the embodiment, the content ranges described above are not tested or verified.

In general, initial temperatures of the first cooling chamber and the second cooling chamber are the same as the corresponding cooling air temperatures.

In a preferred embodiment, the first heat treatment chamber is presented as a square structure and comprises two heating regions disposed facing each other on an inner wall thereof; the alloy workpiece or the metal workpiece is placed directly on a material rack at a center of the square structure, or the alloy workpiece or the metal workpiece is first placed within a cartridge and the cartridge is then placed on the material rack at the center of the square structure; similarly, the second heat treatment chamber is presented as a square structure and comprises two heating regions disposed facing each other on the inner wall of the square structure; the alloy workpiece or the metal workpiece is placed directly on a material rack at a center of the square structure, or the alloy workpiece or the metal workpiece is first placed within a cartridge and the cartridge is then placed on the material rack at the center of the square structure. Based on the structure described above, the high uniformity of the material temperature is achieved and temperature fluctuation is controlled.

In a preferred embodiment, an area of the heating regions exceeds a longitudinal-sectional area of the material rack. Therefore, it is guaranteed that all the cartridges have a uniform heat treatment so that the alloy workpiece or the metal workpiece after heat treatment have consistent properties.

In a preferred embodiment, distances from the cartridge, the alloy workpiece, or the metal workpiece to the two heating regions disposed facing each other are the same, ranging from 2 cm to 30 cm, preferably from 5 cm to 20 cm. During the preparation process, the applicant found that the Nd—Fe—B magnet is extremely sensitive to a secondary tempering temperature difference and the control of the secondary tempering temperature can significantly improve the properties of the Nd—Fe—B magnet and the consistency of the Nd—Fe—B magnet in various regions. In the present application, the cartridges are disposed near the heating regions; and particularly after the distance therebetween is controlled to be 5 cm-20 cm. In the most preferred embodiment, the temperature differences between the cartridges in various regions, between parts of the alloy workpiece in various regions, between parts of the metal workpiece in various regions, or between different parts of the cartridges can be controlled to be within ±5° C., achieving high uniformity of material temperatures and greatly improving the property consistency of the same batch of Nd—Fe—B magnets.

In a preferred embodiment, the Nd—Fe—B magnet is a Nd—Fe—B magnet having a TRE (Total Rare Earth) of 28.8 wt %-34.0 wt %, preferably a Nd—Fe—B magnet having a TRE of 28.8 wt %-30.5 wt %. During the research, it is found that the magnet having a TRE of 28.8 wt %-30.5 wt % is the most sensitive to the temperature difference of secondary tempering temperature difference, and has a higher requirement for the temperature control of a heat treatment.

The Nd—Fe—B magnet mentioned in the present invention is a magnet comprising a Nd—Fe—B as a main phase.

In a preferred embodiment, a first heating chamber, a second heating chamber, a first heat treatment chamber, a first cooling chamber, a third heating chamber, a second heat treatment chamber, and a second cooling chamber sequentially disposed by means of airtight devices are comprised. This is because the time it takes to have the temperature rise to 800° C.-950° C. is about twice of the heat treatment time in the first heat treatment chamber. Providing two heating chambers and adjusting treatment times thereof to be equivalent to the heat treatment time of the first heat treatment chamber ensures the same pace, thereby enabling a continuous production.

In a preferred embodiment, in the second-stage heat treatment, the temperature difference of the alloy workpiece or the metal workpiece in different regions is below ±5° C.

In a preferred embodiment, in the first-stage cooling treatment, an average cooling rate of the alloy workpiece or the metal workpiece in the first 10 min is 6° C./min-15° C./min; in the second-stage cooling treatment, an average cooling rate of the alloy workpiece or the metal workpiece in the first 10 min is 6° C./min-15° C./min.

In the present invention, the average cooling rate in the first 10 min is selected and monitored by means of continuous test and trials. The average cooling rate in the first 5 min-30 min may certainly be selected according to the requirements of the product.

Sintered magnets obtained in each embodiment are measured by following the test method below.

Magnetic performance evaluation process: the magnetic performances of a sintered magnet are tested using a NIM-10000H rare earth permanent magnet non-destructive testing system from National Measurement Institutes in China.

Embodiment 1

Figure 1:
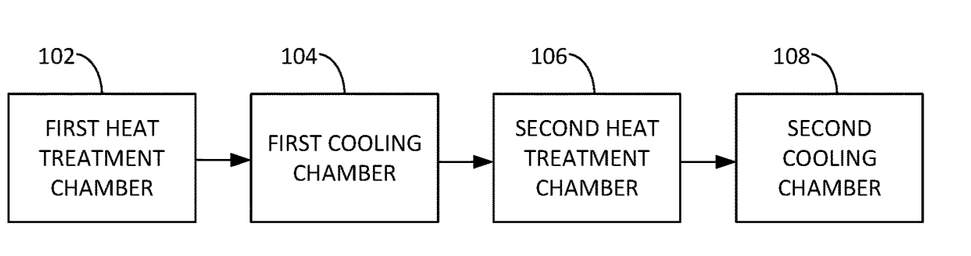
FIG. 1 is an example continuous heat treatment device for an alloy workpiece or a metal workpiece.

Referring to FIG. 1, a continuous heat treatment device, comprising a first heating chamber, a second heating chamber, a first heat treatment chamber 102, a first cooling chamber 104, a third heating chamber, a second heat treatment chamber 106, and a second cooling chamber 108 disposed in sequence; airtight valves are disposed among the first heating chamber, the second heating chamber, the first heat treatment chamber 102, the first cooling chamber 104, the third heating chamber, the second heat treatment chamber 106, and the second cooling chamber 108, as well as a transfer system disposed among the chambers to transfer a sintered Nd—Fe—B magnet.

A continuous heat treatment process is as follows:

(1) Loading

Based on mass percents, a raw material comprising 7.25 wt % of Pr, 21.75 wt % of Nd, 1.5 wt % of Dy, bal. of Fe, 0.97 wt % of B, 0.15 wt % of Cu, 0.2 wt % of Ga, 0.2 wt % of Nb, and 0.8 wt % of Co is prepared into a sintered Nd—Fe—B magnet by means of smelting, melt-spinning, hydrogen crushing, airflow crushing, pressing, and sintering.

Upon testing the properties of the sintered Nd—Fe—B magnet, it is found that Hcj=16.50 kOe, Br=13.70 kGs, and a squareness ratio is 98%.

The sintered Nd—Fe—B magnet is placed within cartridges with through holes; and the cartridges are stacked in two rows on a material rack and then fed into the first heating chamber. It is worth mentioning that in varying embodiments, airtight cartridges may also be used according to different production requirements.

(2) First-Stage Heating

When a Vacuum Degree of the First Heating Chamber Reaches 100 Pa, a Heating Procedure is started; the temperature therein is heated from room temperature for 165 min until the temperature reaches a range of 370° C.-400° C.; and the temperature is maintained at 370° C.-400° C. for 15 min. After the temperature maintaining period, the material rack loaded with the cartridges is transferred from the first heating chamber to the second heating chamber.

(3) Second-Stage Heating

After the material rack loaded with the cartridges enters the second heating chamber and when the vacuum degree reaches 100 Pa, the heating starts and the temperature is heated for 165 min until it reaches 800° C.-850° C.; and the temperature is maintained at 800° C.-850° C. for 15 min. After the temperature maintaining period, the material rack loaded with the cartridges is transferred from the second heating chamber to the first heat treatment chamber 102.

(4) First-Stage Heat Treatment

The first heat treatment chamber 102 is presented as a square structure and comprises two heating regions disposed facing each other on an inner wall of the square structure. An area of the heating regions exceeds a longitudinal-sectional area of the material rack. After the cartridges enter the first heat treatment chamber 102, they are placed in a location having a distance of 25 cm to the two heating regions.

When the vacuum degree reaches 100 Pa, heating starts and the temperature is heated for 10 min until the heat treatment temperature of the first heat treatment chamber 102 (measured at different positions in different cartridges) reaches 880° C.-895° C.; and the temperature is maintained at 880° C.-895° C. for 170 min. After the temperature maintaining period, the material rack loaded with the cartridges is transferred from the first heat treatment chamber 102 to the first cooling chamber 104.

(5) First-Stage Cooling

After the material rack loaded with the cartridges enters the first cooling chamber 104, the first cooling chamber 104 is vacuumed; an inert gas of 78 kPa is introduced into the cooling chamber, and circulation cooling by a fan is then carried out for 180 min. The inert gas temperature in the first cooling chamber 104 is as shown in Table 1; and the inert gas temperature is measured at an outlet of suction circulating air.

(6) Third-Stage Heating

After the cartridges stacked in two rows enter the third heating chamber and when the vacuum degree reaches 100 Pa, the heating starts and the temperature is heated for 165 min until it reaches 460° C.-470° C.; and the temperature is maintained at 460° C.-470° C. for 15 min. After the temperature maintaining period, the material rack loaded with the cartridges is transferred from the third heating chamber to the second heat treatment chamber 106.

(7) Second-Stage Heat Treatment

The second heat treatment chamber 106 is presented as a square structure and comprises two heating regions disposed facing each other on an inner wall of the square structure. An area of the heating regions exceeds a longitudinal-sectional area of the material rack. After the cartridges enter the second heat treatment chamber 106, they are placed in a location having a distance of 25 cm to the two heating regions.

When the vacuum degree reaches 100 Pa, heating starts and the temperature is heated for 15 min until the heat treatment temperature (measured at different positions in different cartridges) reaches 500° C.-515° C.; and the temperature is maintained at 500° C.-515° C. for 165 min. After the temperature maintaining period, the material rack loaded with the cartridges is transferred from the second heat treatment chamber 106 to the second cooling chamber 108.

(8) Second-Stage Cooling

After the material rack loaded with the cartridges enters the second cooling chamber 108, the second cooling chamber 108 is vacuumed; an inert gas of 78 kPa is introduced into the cooling chamber, and circulation cooling by a fan is then carried out for 180 min. The material rack loaded with the cartridges is removed from a furnace. The inert gas temperature in the second cooling chamber 108 is as shown in Table 1; and the inert gas temperature is measured at an outlet of suction circulating air.

Therefore, the material rack loaded with the cartridges is heated and the temperature after heating is maintained for a short time; afterwards, the material rack enters the second heating chamber for heating and the temperature after heating is maintained for a short time. Then, the material rack loaded with the cartridges enters the first heat treatment chamber 102 for a short-period heating and the temperature after heating is maintained for a short time. After the temperature-maintaining after heating is finished in the first heat treatment chamber 102, the material rack loaded with the cartridges enters the first cooling chamber 104 for cooling. At the end of the cooling in the first cooling chamber 104, the material rack loaded with the cartridges enters the third heating chamber for heating and the temperature after heating is maintained for a short time. After the temperature-maintaining after heating is finished in the third heating chamber, the material rack loaded with the cartridges enters the second heat treatment chamber 106 for a short-period heating and the temperature after heating is maintained for a short time. After the temperature-maintaining after heating is finished, the material rack loaded with the cartridges enters the second cooling chamber 108 for cooling. At the end of the cooling, the material rack loaded with the cartridges is unloaded.

After the above heat treatment and cooling treatment, the properties of the magnet are shown in Table 1.

TABLE 1

Inert gas temperatures in the first and second cooling chambers, and the properties of the magnet after heat treatment and cooling treatment

| Item | Inert gas temperature in the first cooling chamber (° C.) | Inert gas temperature in the second cooling chamber (° C.) | After heat treatment and cooling treatment | | |
|---|---|---|---|---|---|
| | | | Br(kGs) | Hcj(KOe) | SQ (%) |
| Comparative Example 1.1 | 460-470 | 370-380 | 13.69 | 18.6 | 96 |
| Comparative Example 1.2 | 430-440 | 70-80 | 13.70 | 18.8 | 97 |
| Comparative Example 1.3 | 250-260 | 350-360 | 13.68 | 18.7 | 97 |
| Embodiment 1.1 | 420-430 | 190-200 | 13.71 | 19.3 | 98 |
| Embodiment 1.2 | 320-330 | 150-160 | 13.69 | 19.4 | 98 |
| Embodiment 1.3 | 310-320 | 70-80 | 13.70 | 19.7 | 99 |
| Embodiment 1.4 | 90-100 | 90-100 | 13.70 | 19.6 | 98 |
| Embodiment 1.5 | 25-35 | 25-35 | 13.72 | 19.8 | 99 |
| Embodiment 1.6 | 200-210 | 25-35 | 13.70 | 19.7 | 99 |
| Comparative Example 1.4 | 10-20 | 10-20 | Cracks on the surface are seen in a small amount of magnets. | | |

The test results show that in the first-stage cooling treatment of Embodiment 1.4, Embodiment 1.5, and Embodiment 1.6, the average cooling rate of the sintered Nd—Fe—B magnet in the first 10 min is 6° C./min-15° C./min; in the second-stage cooling treatment of Embodiment 1.3, Embodiment 1.4, Embodiment 1.5, and Embodiment 1.6, the average cooling rate of the sintered Nd—Fe—B magnet in the first 10 min is 6° C./min-15° C./min. In the first-stage cooling treatment of Embodiment 1.1, Embodiment 1.2, and Embodiment 1.3, the average cooling rate of the sintered Nd—Fe—B magnet in the first 10 min is less than 6° C./min; in the second-stage cooling treatment of Embodiment 1.1 and Embodiment 1.2, the average cooling rate of the sintered Nd—Fe—B magnet in the first 10 min is less than 6° C./min, too.

Based on Table 1, one can see that the cooling air temperature of the first cooling chamber 104 is higher than 25° C. and lower than the heat treatment temperature of the first heat treatment chamber 102 by at least 450° C.; at the same time, the inert gas temperature of the second cooling chamber 108 is higher than 25° C. and lower than the heat treatment temperature of the second heat treatment chamber 106 by at least 300° C. The magnet after heat treatment has better magnetic properties; of those, Hcj is particularly enhanced significantly, and SQ is improved. This is because the above-mentioned temperature ranges facilitates the cooling rate of the high-temperature part of the magnet after the heat treatment, thereby optimizing the phase composition and distribution of the grain boundary microstructure.

Embodiment 2

A continuous heat treatment device, comprising a first heating chamber, a second heating chamber, a first heat treatment chamber 102, a first cooling chamber 104, a third heating chamber, a second heat treatment chamber 106, and a second cooling chamber 108 disposed in sequence; airtight valves are disposed among the first heating chamber, the second heating chamber, the first heat treatment chamber 102, the first cooling chamber 104, the third heating chamber, the second heat treatment chamber 106, and the second cooling chamber 108, as well as a transfer system disposed among the chambers to transfer a sintered Nd—Fe—B magnet.

The continuous heat treatment process is as follows:
(1) Loading

Based on mass percents, a raw material comprising 7.12 wt % of Pr, 21.38 wt % of Nd, 1.5 wt % of Tb, bal. of Fe, 0.96 wt % of B, 0.15 wt % of Cu, 0.2 wt % of Ga, 0.2 wt % of Nb, and 0.8 wt % of Co is prepared into a sintered Nd—Fe—B magnet by means of smelting, melt-spinning, hydrogen crushing, airflow crushing, pressing, and sintering.

Upon testing the properties of the sintered Nd—Fe—B magnet, it is found that Hcj=16.50 kOe, Br=14.20 kGs, and a squareness ratio is 97%.

The sintered Nd—Fe—B magnet is placed within cartridges with grids; and the cartridges are stacked in a single row on a material rack and then fed into the first heating chamber.

(2) First-Stage Heating

When a vacuum degree of the first heating chamber reaches 150 Pa, a heating procedure is started; the temperature therein is heated from room temperature for 150 min until the temperature reaches a range of 350-380° C.; and the temperature is maintained at 350° C.-380° C. for 30 min. After the temperature maintaining period, the material rack loaded with the cartridges is transferred from the first heating chamber to the second heating chamber.

(3) Second-Stage Heating

After the material rack loaded with the cartridges enters the second heating chamber and when the vacuum degree reaches 150 Pa, the heating starts and the temperature is heated for 150 min until it reaches 820-860° C.; and the temperature is maintained at 820° C.-860° C. for 30 min. After the temperature maintaining period, the material rack loaded with the cartridges is transferred from the second heating chamber to the first heat treatment chamber 102.

(4) First-Stage Heat Treatment

The first heat treatment chamber 102 is presented as a square structure and comprises two heating regions disposed facing each other on an inner wall of the square structure. An area of the heating regions exceeds a longitudinal-sectional area of the material rack. After the cartridges enter the first heat treatment chamber 102, they are placed in a location having a distance of 2-30 cm to the two heating regions, specifically as shown in Table 2.

When the vacuum degree reaches 150 Pa, heating starts and the temperature is heated for 5 min; the heat treatment temperatures at different areas of different cartridges in various regions are measured; the temperatures are specifically as shown in Table 2; and the temperature after heating is maintained for 175 min. After the temperature maintaining period, the material rack loaded with the cartridges is transferred from the first heat treatment chamber 102 to the first cooling chamber 104.

(5) First-Stage Cooling

After the material rack loaded with the cartridges enters the first cooling chamber 104, the first cooling chamber 104 is vacuumed; a 40° C.-50° C. inert gas of 76 kPa is introduced into the cooling chamber; and the circulation cooling by a fan is carried out for 180 min. The average cooling rate of the sintered Nd—Fe—B magnet in the first 10 min is 15° C./min. The inert gas temperature is measured at an outlet of suction circulating air.

(6) Third-Stage Heating

After the material rack loaded with the cartridges enters the third heating chamber and when the vacuum degree reaches 150 Pa, the heating starts and the temperature is heated for 170 min until it reaches 380° C.-420° C.; and the temperature is maintained at 380° C.-420° C. for 10 min. After the temperature maintaining period, the material rack loaded with the cartridges is transferred from the third heating chamber to the second heat treatment chamber 106.

(7) Second-Stage Heat Treatment

The second heat treatment chamber 106 is presented as a square structure and comprises two heating regions disposed facing each other on an inner wall of the square structure. An area of the heating regions exceeds a longitudinal-sectional area of the material rack. After the cartridges enter the second heat treatment chamber 106, they are placed in a location having a distance of 2-30 cm to the two heating regions, specifically as shown in Table 2.

When the vacuum degree reaches 150 Pa, heating starts and the temperature is heated for 10 min; the heat treatment temperatures at different areas of different cartridges in various regions are measured; the temperatures are specifically as shown in Table 2; and the temperature after heating is maintained for 170 min. After the temperature maintaining period, the material rack loaded with the cartridges is transferred from the second heat treatment chamber 106 to the second cooling chamber 108.

(8) Second-Stage Cooling

After the material rack loaded with the cartridges enters the second cooling chamber 108, the second cooling chamber 108 is vacuumed; a 40° C.-50° C. inert gas of 76 kPa is introduced into the cooling chamber; and the circulation cooling by a fan is carried out for 180 min. The average cooling rate of the sintered Nd—Fe—B magnet in the first 10 min is 9.0° C./min. The material rack loaded with the cartridges is removed from a furnace. The inert gas temperature is measured at an outlet of suction circulating air.

After the above heat treatment and cooling treatment, the properties of the magnet are shown in Table 2. The distance in Table 2 refers to the distance between the cartridges stacked in a single row and the heating regions at two sides.

Br, Hcj, BH (max) and SQ of 20 sintered Nd—Fe—B magnets sampled from different regions are measured; and the consistency is further measured. Consistency is described by the fluctuation of the product performance index; and the fluctuation is defined as (Max value-Min value)/Min value. A smaller fluctuation indicates a better consistency.

TABLE 2

Heat treatment temperatures in the first-stage heat treatment and the second heat treatment, and the properties of the magnet after heat treatment and cooling treatment

| | First-stage heat treatment | | Second-stage heat treatment | | After heat treatment and cooling treatment | | |
|---|---|---|---|---|---|---|---|
| Item | Distance (cm) | Heat treatment temperature (° C.) | Distance (cm) | Heat treatment temperature (° C.) | Br fluctuation (%) | Hcj fluctuation (%) | SQ fluctuation (%) |
| Embodiment 2.1 | 30 | 865-880 | 30 | 500-525 | 0.60 | 5 | 4 |
| Embodiment 2.2 | 25 | 870-885 | 25 | 515-535 | 0.58 | 3 | 3 |
| Embodiment 2.3 | 20 | 880-890 | 20 | 530-540 | 0.61 | 2.01 | 2.5 |
| Embodiment 2.4 | 10 | 890-895 | 10 | 540-545 | 0.58 | 1.05 | 2 |
| Embodiment 2.5 | 5 | 895-900 | 5 | 545-550 | 0.60 | 1.05 | 2 |
| Embodiment 2.6 | 2 | 895-910 | 2 | 545-560 | 0.56 | 6 | 7 |
| Embodiment 2.7 | 30 | 865-880 | 10 | 540-545 | 0.60 | 1.15 | 2 |

The data in Table 2 shows that a smaller fluctuation in the second-stage heat treatment temperature leads to an essentially stable Br and smaller fluctuations in both Hcj and SQ. This is because the second-stage heat treatment temperature is closely related to the phase composition and distribution of the grain boundary microstructure of the magnet; and a greater temperature fluctuation results in a greater property fluctuation.

The state of the microstructure has a great influence on the property of NdFeB. The more uniform the microstructure is and the finer the grain is, the better the property of the material is and the higher the property consistency will be; moreover, the optimization of the microstructure of the sintered NdFeB material mainly occurs in the heat treatment stage. Therefore, the heat treatment process has a great impact on the properties of the material. The same formulation may vary greatly in magnetic properties due to heat treatment process differences. The present invention improves the uniformity of the structure by improving the temperature uniformity, and then solidifies the uniform structure by means of a high cooling rate so that the structure of each product is uniform and consistent, thereby achieving the goal of improving the properties and uniformity of the material.

Embodiment 3

A continuous heat treatment device, comprising a first heating chamber, a second heating chamber, a first heat treatment chamber 102, a first cooling chamber 104, a third heating chamber, a second heat treatment chamber 106, and a second cooling chamber 108 disposed in sequence; airtight valves are disposed among the first heating chamber, the second heating chamber, the first heat treatment chamber 102, the first cooling chamber 104, the third heating chamber, the second heat treatment chamber 106, and the second cooling chamber 108, as well as a transfer system disposed among the chambers to transfer a sintered Nd—Fe—B magnet.

The continuous heat treatment process is as follows:

(1) Loading

Based on mass percents, a raw material comprising 8 wt % of Pr, 19 wt %-21.5 wt % of Nd (adjustable according to the TRE in Table 3), 1.5 wt % of Tb, bal. of Fe, 0.97 wt % of B, 0.1 wt % of Cu, 0.1 wt % of Ga, 0.1 wt % of Nb, and 1 wt % of Co is prepared into a sintered Nd—Fe—B magnet by means of smelting, melt-spinning, hydrogen crushing, airflow crushing, pressing, and sintering. The level of the TRE content and the magnet properties are shown in Table 3.

The sintered Nd—Fe—B magnet is placed within cartridges with grids; and the cartridges are stacked in a single row on a material rack and then fed into the first heating chamber.

(2) First-Stage Heating

When a Vacuum Degree of the First Heating Chamber Reaches $10^{-1}$ Pa, a Heating Procedure is started; the temperature therein is heated from room temperature for 130 min until the temperature reaches a range of 360° C.-400° C.; and the temperature is maintained at 360° C.-400° C. for 20 min. After the temperature maintaining period, the material rack loaded with the cartridges is transferred from the first heating chamber to the second heating chamber.

(3) Second-Stage Heating

After the Material Rack Loaded with the Cartridges Enters the Second Heating Chamber and when the vacuum degree reaches $10^{-1}$ Pa, the heating starts and the temperature is heated for 130 min until it reaches 810° C.-830° C.; and the temperature is maintained at 810° C.-830° C. for 20 min. After the temperature maintaining period, the material rack loaded with the cartridges is transferred from the second heating chamber to the first heat treatment chamber 102.

(4) First-Stage Heat Treatment

The first heat treatment chamber 102 is presented as a square structure and comprises two heating regions disposed facing each other on an inner wall of the square structure. An area of the heating regions exceeds a longitudinal-sectional area of the material rack. After the material rack with the cartridges enter the first heat treatment chamber 102, they are placed in a location having a distance of 5 cm to the two heating regions.

When the vacuum degree reaches $10^{-1}$ Pa, heating starts and the temperature is heated for 10 min until the heat treatment temperature of the first heat treatment chamber 102 (measured at different positions in different cartridges) reaches 905° C.-910° C.; and the temperature is maintained at 905° C.-910° C. for 140 min. After the temperature maintaining period, the material rack loaded with the cartridges is transferred from the first heat treatment chamber 102 to the first cooling chamber 104.

(5) First-Stage Cooling

After the material rack loaded with the cartridges enters the first cooling chamber 104 and when the vacuum degree therein reaches $10^{-1}$ Pa, a 70° C.-90° C. inert gas of 80 kPa is introduced into the cooling chamber; and the circulation cooling by a fan is carried out for 150 min. The average cooling rate of the sintered Nd—Fe—B magnet in the first 10 min is 6.5° C./min. The inert gas temperature is measured at an outlet of suction circulating air.

(6) Third-Stage Heating

After the material rack loaded with the cartridges enters the third heating chamber and when the vacuum degree reaches $10^{-1}$ Pa, the heating starts and the temperature is heated for 140 min until it reaches 400° C.-425° C.; and the temperature is maintained at 400° C.-425° C. for 10 min. After the temperature maintaining period, the material rack loaded with the cartridges is transferred from the third heating chamber to the second heat treatment chamber 106.

(7) Second-Stage Heat Treatment

The second heat treatment chamber 106 is presented as a square structure and comprises two heating regions disposed facing each other on an inner wall of the square structure. An area of the heating regions exceeds a longitudinal-sectional area of the material rack. After the material rack with the cartridges enter the second heat treatment chamber 106, they are placed in a location having a distance of 5 cm to the two heating regions.

After the material rack with the cartridges enter the second heat treatment chamber 106 and when the vacuum degree reaches $10^{-1}$ Pa, heating starts and the temperature is heated for 10 min until the heat treatment temperature of the second heat treatment chamber 106 (measured at different positions in different cartridges) reaches 535° C.-540° C.; and the temperature is maintained at 535° C.-540° C. for 140 min. After the temperature maintaining period, the material rack loaded with the cartridges is transferred from the second heat treatment chamber 106 to the second cooling chamber 108.

(8) Second-Stage Cooling

After the material rack loaded with the cartridges enters the second cooling chamber 108 and when the vacuum degree therein reaches $10^{-1}$ Pa, a 30° C.-60° C. inert gas of 80 kPa is introduced into the cooling chamber; and the circulation cooling by a fan is carried out for 150 min. The average cooling rate of the sintered Nd—Fe—B magnet in the first 10 min is 6.0° C./min. The material rack loaded with the cartridges is removed from a furnace. The inert gas temperature is measured at an outlet of suction circulating air.

After the above heat treatment and cooling treatment, the properties of the magnet are shown in Table 3.

TABLE 3

TRE and magnet properties before and after heat treatment and cooling treatment

| Item | Before heat treatment and cooling treatment | | | | After heat treatment and cooling treatment | | |
|---|---|---|---|---|---|---|---|
| | TRE (wt %) | Br (kGs) | Hcj (KOe) | SQ (%) | Br fluctuation (%) | Hcj fluctuation (%) | SQ fluctuation (%) |
| Embodiment 3.1 | 31.0 | 14.00 | 22.01 | 98 | 0.65 | 1.38 | 3 |
| Embodiment 3.2 | 30.5 | 14.10 | 21.8 | 99 | 0.58 | 1.58 | 2 |
| Embodiment 3.3 | 29.5 | 14.25 | 21.2 | 99 | 0.60 | 1.63 | 2 |
| Embodiment 3.4 | 28.8 | 14.30 | 21 | 98 | 0.63 | 1.85 | 2 |
| Comparative Example 3.1 | 28.5 | 14.36 | 20.1 | 96 | 0.72 | 1.98 | 5 |

The Br fluctuation (%), Hcj fluctuation (%), and SQ fluctuation (%) of the magnet before the heat and cooling treatments are zero.

Generally, in the existing heat treatment process, a magnet with a TRE of more than 30.5% has a good consistency during heat treatment; and for a magnet with a TRE of 28.8 wt % to 30.5 wt %, one or a plurality of Br fluctuation (%), Hcj fluctuation (%) and SQ fluctuation (%) will reach 5% or more in the heat treatment process, which in turn affect product consistency.

It is found that a magnet having a TRE of 28.8 wt % to 30.5 wt %, heat-treated in the above-mentioned heat treatment device having a small temperature difference and an average cooling rate controlled in the first 10 min, has an reduction in Br fluctuation (%), Hcj fluctuation (%), and SQ fluctuation (%), which can significantly improve the consistency.

One can see from Table 3 that increasing the temperature uniformity of the planar of a heat treatment device and controlling its cooling rate has a very significant positive effect on improving the property consistency of the NdFeB with a low TRE.

COMPARATIVE EXAMPLE

A continuous heat treatment device comprises a first heat treatment chamber and a second heat treatment chamber disposed in sequence; an airtight valve is disposed therebetween, as well as a transfer system disposed therebetween to transfer a sintered Nd—Fe—B magnet.

The continuous heat treatment process is as follows:

Based on mass percents, a raw material comprising 8 wt % of Pr, 20 wt % of Nd, 1.5 wt % of Tb, bal. of Fe, 0.97 wt % of B, 0.1 wt % of Cu, 0.1 wt % of Ga, 0.1 wt % of Nb, and 1 wt % of Co is prepared into a sintered Nd—Fe—B magnet by means of smelting, melt-spinning, hydrogen crushing, airflow crushing, pressing and sintering with the specific process parameters being the same as those in Example 3.

The sintered Nd—Fe—B magnet is placed within cartridges with grids; and the cartridges are stacked in a single row on a material rack and then fed into the first heat treatment chamber.

After the material rack with the cartridges enter the second heat treatment chamber, they are placed at a position having a distance of 5 cm to the two heating regions; and when the vacuum degree reaches $10^{-1}$ Pa, heating starts and the temperature is heated for 180 min until the heat treatment temperature of the second heat treatment chamber (measured at different positions in different cartridges) reaches 905° C.-910° C.; and the temperature is maintained at 905° C.-910° C. for 140 min. At the end of the temperature-maintaining period, a 70° C.-90° C. inert gas of 80 kPa is introduced into the first heat treatment chamber; and the circulation cooling by a fan is then carried out for 150 min. The inert gas temperature is measured at an outlet of suction circulating air. The average cooling rate of the sintered Nd—Fe—B magnet in the first 10 min is 5° C./min. The material rack loaded with the cartridges is transported from the first heat treatment chamber to the second heat treatment chamber.

After the material rack with the cartridges enter the second heat treatment chamber, they are placed at a position having a distance of 5 cm to the two heating regions; and when the vacuum degree reaches $10^{-1}$ Pa, heating starts and the temperature is heated for 90 min until the heat treatment temperature of the second heat treatment chamber (measured at different positions in different cartridges) reaches 535° C.-540° C.; and the temperature is maintained at 535° C.-540° C. for 140 min. At the end of the temperature-maintaining period, a 30° C.-60° C. inert gas of 80 kPa is introduced into the second heat treatment chamber, and the circulation cooling by a fan is then carried out for 150 min. The inert gas temperature is measured at an outlet of suction circulating air. The average cooling rate of the sintered Nd—Fe—B magnet in the first 10 min is 4.5° C./min.

TABLE 4

TRE and magnet properties before and after single-chamber heat treatment and cooling treatment

| Item | Before heat treatment and cooling treatment | | | | After heat treatment and cooling treatment | | |
|---|---|---|---|---|---|---|---|
| | TRE (wt %) | Br (kGs) | Hcj (KOe) | SQ (%) | Br fluctuation (%) | Hcj fluctuation (%) | SQ fluctuation (%) |
| Comparative Example 4.1 | 29.5 | 14.25 | 21.2 | 99 | 0.66 | 8 | 5 |

It is assumed that the Br fluctuation (%), Hcj fluctuation (%), and SQ fluctuation (%) of the magnet before the heat and cooling treatments are zero.

One can see from Table 3 and Table 4 that heat treatment and cooling treatment carried out in the single chamber result in a lower cooling rate for the high-temperature part of the material; Br and SQ in the single chamber treatment are slightly decreased; the Hcj drop is more obvious, and the fluctuation of the three has a significant change.

The embodiments described above only serve to further illustrate some particular embodiments of the present disclosure; however, the present invention is not limited to these embodiments. Any simple alternations, equivalent changes, and modifications made to the embodiments above according to the technical essence of the present invention shall fall within the protection scope of the technical solutions of the present invention.

The invention claimed is:

1. A continuous heat treatment method for an alloy workpiece or a metal workpiece, comprising:
a first-stage heat treatment performed in a first heat treatment chamber, wherein the first heat treatment chamber is presented as a square structure and comprises two heating regions disposed facing each other on an inner wall of the square structure of the first heat treatment chamber, and the first-stage heat treatment comprises directly placing the alloy workpiece or the metal workpiece on a first material rack at a center of the square structure of the first heat treatment chamber, or first placing the alloy workpiece or the metal workpiece within a first cartridge and then placing the first cartridge on the first material rack at the center of the square structure the first heat treatment chamber,
a first-stage air cooling treatment,
a second-stage heat treatment performed in a second heat treatment chamber, wherein the second heat treatment chamber is presented as a square structure and comprises two heating regions disposed facing each other on an inner wall of the square structure of the second heat treatment chamber, and the second-stage heat treatment comprises directly placing the alloy workpiece or the metal workpiece is on a second material rack at a center of the square structure of the second heat treatment chamber, or first placing the alloy workpiece or the metal workpiece within a second cartridge and then placing the second cartridge on the second material rack at the center of the square structure of the second heat treatment chamber, and
a second-stage air cooling treatment, wherein:
the first-stage heat treatment, the first-stage air cooling treatment, the second-stage heat treatment, and the second-stage air cooling treatment are performed in sequence in air-tight chambers;
a cooling air temperature of the first-stage air cooling treatment is 25° C. or above and lower than a heat treatment temperature of the first-stage heat treatment by at least 450° C.; and a cooling air temperature of the second-stage air cooling treatment is 25° C. or above and lower than a heat treatment temperature of the second-stage heat treatment by at least 300° C.

2. The continuous heat treatment method for an alloy workpiece or a metal workpiece according to claim 1, wherein the alloy workpiece is a sintered Nd—Fe—B magnet.

3. The continuous heat treatment method for an alloy workpiece or a metal workpiece according to claim 2, wherein in the second-stage heat treatment, a temperature difference of the alloy workpiece or the metal workpiece in different regions is below ±5° C.

4. The continuous heat treatment method for an alloy workpiece or a metal workpiece according to claim 1, wherein:
in the first-stage air cooling treatment, an average cooling rate of the alloy workpiece or the metal workpiece in a first 10 minutes is 6° C./min-15° C./min; and
in the second-stage air cooling treatment, an average cooling rate of the alloy workpiece or the metal workpiece in a first 10 minutes is 6° C./min-15° C./min.

5. A continuous heat treatment device for an alloy workpiece or a metal workpiece, comprising:
a first heat treatment chamber,
a first cooling chamber,
a second heat treatment chamber,
a second cooling chamber, wherein the first heat treatment chamber, the first cooling chamber, the second heat treatment chamber, and the second cooling chamber are disposed in sequence by means of airtight devices, and
a transfer system disposed among the first heat treatment chamber, the first cooling chamber, the second heat treatment chamber, and the second cooling chamber to transfer the alloy workpiece or the metal workpiece, wherein:
both the first cooling chamber and the second cooling chamber adopt an air cooling system;
a cooling air temperature of the first cooling chamber is 25° C. or above and lower than a heat treatment temperature of the first heat treatment chamber by at least 450° C.;
a cooling air temperature of the second cooling chamber is 25° C. or above and lower than a heat treatment temperature of the second heat treatment chamber by at least 300° C.;
a pressure of the first cooling chamber and a pressure of the second cooling chamber are 50 kPa-100 kPa;

the first heat treatment chamber is presented as a square structure and comprises two heating regions disposed facing each other on an inner wall of the square structure of the first heat treatment chamber;

the alloy workpiece or the metal workpiece is placed directly on a first material rack at a center of the square structure of the first heat treatment chamber, or the alloy workpiece or the metal workpiece is first placed within a first cartridge and the first cartridge is then placed on the first material rack at the center of the square structure the first heat treatment chamber;

the second heat treatment chamber is presented as a square structure and comprises two heating regions disposed facing each other on an inner wall of the square structure of the second heat treatment chamber;

the alloy workpiece or the metal workpiece is placed directly on a second material rack at a center of the square structure of the second heat treatment chamber, or the alloy workpiece or the metal workpiece is first placed within a second cartridge and the second cartridge is then placed on the second material rack at the center of the square structure of; and the transfer system is used to transfer at least one of the first material rack or the second material rack between any two or more of the first heat treatment chamber, the first cooling chamber, the second heat treatment chamber, and the second cooling chamber.

6. The continuous heat treatment device for an alloy workpiece or a metal workpiece according to claim 5, wherein the alloy workpiece is a sintered Nd—Fe—B magnet.

7. The continuous heat treatment device for an alloy workpiece or a metal workpiece according to claim 5, wherein the air cooling system is an air cooling system adopting an inert gas.

8. The continuous heat treatment device for an alloy workpiece or a metal workpiece according to claim 7, wherein:
   the heat treatment temperature of the first heat treatment chamber is 800° C.-950° C.;
   the cooling air temperature of the first cooling chamber is 25° C.-150° C.;
   the heat treatment temperature of the second heat treatment chamber is 400° C.-650° C.;
   the cooling air temperature of the second cooling chamber is 25° C.-100° C.;
   in a first-stage air cooling treatment performed in the first cooling chamber, an average cooling rate of the alloy workpiece or the metal workpiece in a first 10 minutes of the first-stage air cooling treatment is 6° C./min-15° C./min; and
   in a second-stage air cooling treatment performed in the second cooling chamber, an average cooling rate of the alloy workpiece or the metal workpiece in a first 10 minutes of the second-stage air cooling treatment is 6° C./min-15° C./min.

9. The continuous heat treatment device for an alloy workpiece or a metal workpiece according to claim 5, wherein:
   an area of the two heating regions of the first heat treatment chamber exceeds a longitudinal-sectional area of the first material rack; and
   an area of the two heating regions of the second heat treatment chamber exceeds a longitudinal-sectional area of the second material rack.

10. The continuous heat treatment device for an alloy workpiece or a metal workpiece according to claim 5, wherein:
    in the first heat treatment chamber, distances from the first cartridge, the alloy workpiece, or the metal workpiece to the two heating regions of the first heat treatment chamber disposed facing each other are the same, ranging from 5 cm to 20 cm; and
    in the second heat treatment chamber, distances from the second cartridge, the alloy workpiece, or the metal workpiece to the two heating regions of the second heat treatment chamber disposed facing each other are the same, ranging from 5 cm to 20 cm, and a temperature difference of the alloy workpiece or the metal workpiece in different regions is below ±5° C.

11. The continuous heat treatment device for an alloy workpiece or a metal workpiece according to claim 10, wherein:
    wherein the alloy workpiece is a sintered Nd—Fe—B magnet; and
    the sintered Nd—Fe—B magnet is a Nd—Fe—B magnet having a total rare earth (TRE) of 28.8 wt %-30.5 wt %.

12. The continuous heat treatment device for an alloy workpiece or a metal workpiece according to claim 5, wherein the first material rack and the second material rack are a same material rack.

* * * * *